United States Patent [19]

Palermo et al.

[11] Patent Number: 4,484,692
[45] Date of Patent: Nov. 27, 1984

[54] WALL MOUNTED HOUSING FOR CABLE TELEVISION COMPONENTS

[76] Inventors: Michael A. Palermo; James L. Mason, both of P.O. Box 154, Sicklerville, N.J. 08081

[21] Appl. No.: 543,409

[22] Filed: Oct. 19, 1983

[51] Int. Cl.³ .............................................. B65D 43/20
[52] U.S. Cl. ..................................... 220/346; 220/18; 220/210; 220/3.8
[58] Field of Search ................... 220/345, 346, 3.8, 18, 220/210

[56] References Cited

U.S. PATENT DOCUMENTS

| | | | |
|---|---|---|---|
| 1,486,415 | 3/1924 | Casper | 220/346 |
| 3,276,618 | 10/1966 | Relich | 220/346 |
| 3,362,564 | 1/1968 | Mueller | 220/346 |
| 3,856,177 | 12/1974 | Fudge | 220/346 |

Primary Examiner—George T. Hall
Attorney, Agent, or Firm—Duffield & Lehrer

[57] ABSTRACT

A substantially rectangularly shaped metal housing includes a top wall, a rear wall, a pair of side walls and a bottom wall. The front edges of the side walls carry a pair of opposed, vertically extending channel members which are adapted to accommodate the side edges of a substantially rectangularly shaped front cover. A lock is mounted at the upper central portion of the cover which locks into a cooperating element on the inside top wall. The lock also interferes with the bottom wall when the cover is slid downwardly to allow the cover to be suspended by the housing. One of the upper corners of the cover is cut off so that the cover can be rotated and removed when in the suspended position. A strand bar extends between and is supported by a pair of opposed tapered indentations in the interior side walls.

10 Claims, 6 Drawing Figures

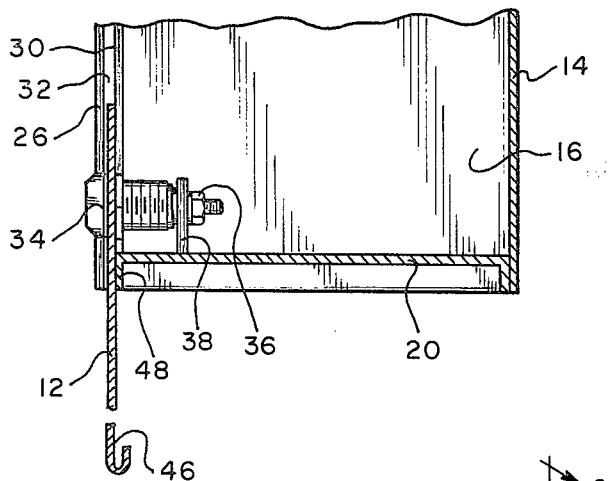
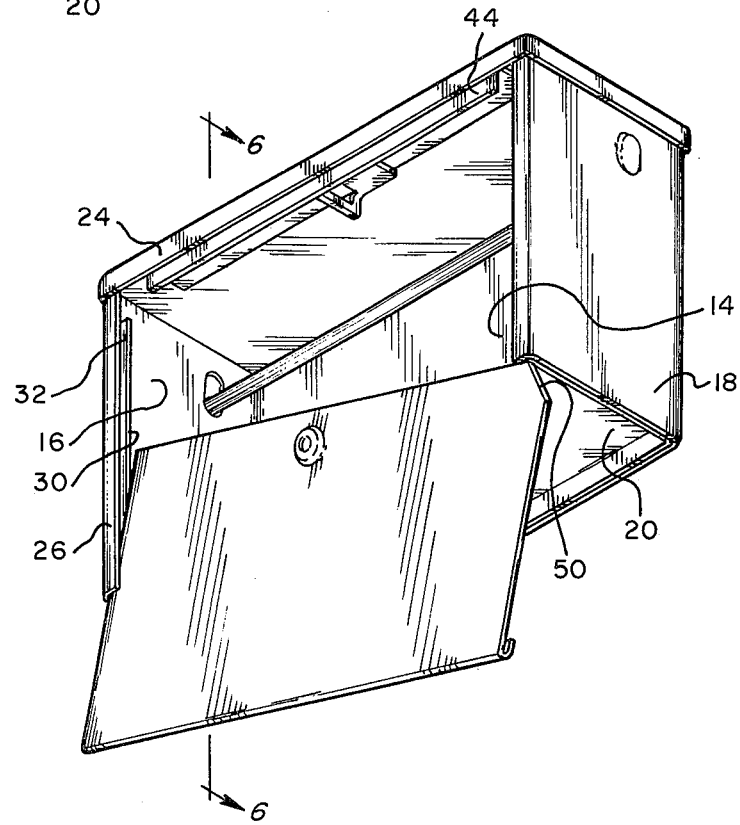
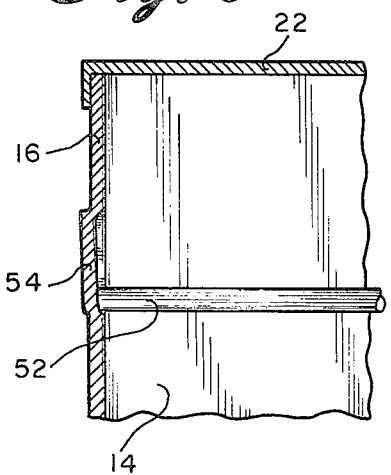

WALL MOUNTED HOUSING FOR CABLE TELEVISION COMPONENTS

BACKGROUND OF THE INVENTION

The present invention is directed toward a wall mounted housing for cable television components and more particularly toward such a housing which is substantially tamper proof and which is intended to be utilized in apartment complexes and the like.

Wall mounted housings of the class to which the present invention belongs have been known and used for many years. Such devices have been used for housing telephone and other electrical connections and the like. More recently, such devices have been used for housing cable connections and related components for cable television particularly in apartment complexes and other multi-resident dwellings.

It is not uncommon, particularly in new construction, for a cable television company to wire all apartments in a building for cable television. However, not all of the individual cables will be connected to the main cable. Only those residents who subscribe will have their cable connected. Furthermore, different channels are normally available and not all subscribers may subscribe to all of the available programming. The equipment and connections needed to select the appropriate channels are normally located at the point of connection between the individual cables and the main incoming cable.

In order to prevent an apartment owner or other unauthorized person from connecting his cable to the main cable when he is not a subscriber or from obtaining access to an unsubscribed channel, the various connections and components are normally mounted in a tamper-proof housing. However, most housings which have been designed to be tamper proof have not always performed their function. It has been Applicants' experience that tenants have been able to open substantially all known prior art housings. This is frequently done by prying a part thereof open. This is not only is expensive since the housing must be repaired or replaced but the cable companies lose extremely large and unknown sums of money due to stolen services from tenants who are not paying subscribers.

There are various other features of the prior art devices known to Applicants which are also undesirable. Whenever the connections or equipment within the housing need service, the service person must remove a cover member. In prior devices known to Applicants, the cover members are totally removable and the service person must then find a place to temporarily store the cover member and hope that it is not damaged or lost in the interim. Furthermore, many of the housings require the use of a strand bar for supporting various types of cable television components and cables. In all prior devices known to Applicants, these bars are supported by hangers which must be mounted on the inner walls of the housings. The use of such hangers increases the cost of production of the housings.

SUMMARY OF THE INVENTION

The present invention is designed to overcome the deficiencies of the prior art discussed above. This is accomplished by providing a substantially rectangularly shaped metal housing including a top wall, a rear wall, a pair of side walls and a bottom wall. The front edges of the side walls carry a pair of opposed, vertically extending channel members which are adapted to accommodate the side edges of a substantially rectangularly shaped front cover. A lock is mounted at the upper central portion of the cover which locks into a cooperating element on the inside top wall. The lock also interferes with the bottom wall when the cover is slid downwardly to allow the cover to be suspended by the housing. One of the upper corners of the cover is cut off so that the cover can be rotated and removed when in the suspended position. A strand bar extends between and is supported by a pair of opposed tapered indentations in the interior side walls.

BRIEF DESCRIPTION OF THE DRAWINGS

For the purpose of illustrating the invention, there is shown in the accompanying drawing one form which is presently preferred; it being understood that the invention is not intended to be limited to the precise arrangements and instrumentalities shown.

FIG. 4 is a cross-sectional view taken through the line 4—4 of FIG. 3;

FIG. 5 is a view similar to FIG. 3 but showing the manner in which the cover member can be removed, and FIG. 6 is a partial cross-sectional view taken through the line 6—6 of FIG. 5.

DETAILED DESCRIPTION OF THE PREFERRED EMBODIMENT

Figure 1:
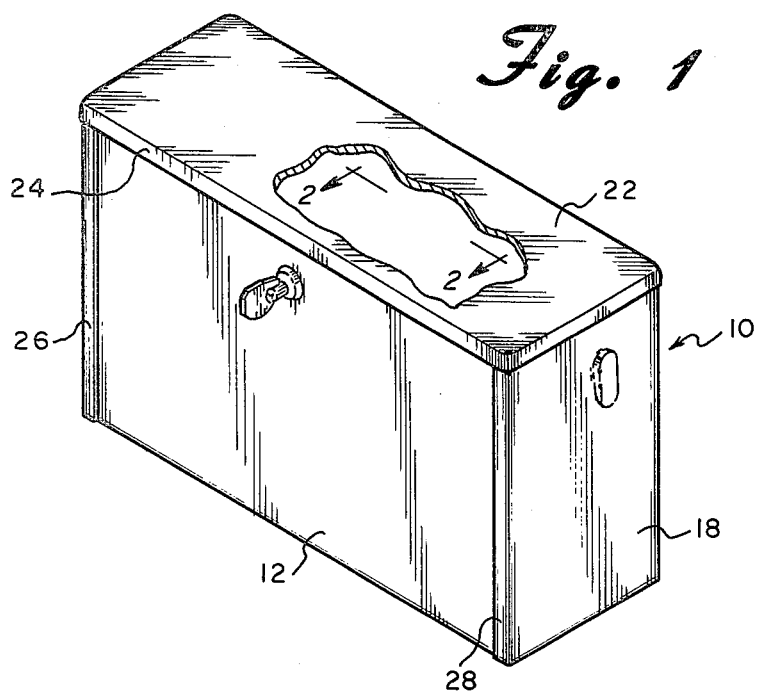
FIG. 1 is a front, top perspective view of a wall mounted housing for cable television components constructed in accordance with the principles of the present invention.

Referring now to the drawings in detail wherein like reference numerals have been used throughout the various figures to designate like elements, there is shown in the figures a wall mounted housing for cable television components constructed in accordance with the principles of the present invention and designated generally as 10. FIG. 1 illustrates the housing with the front cover member 12 in place and FIG. 3 shows the same with the cover member 12 in its lowered and suspended position wherein a technician or other authorized person can gain access to the interior of the housing.

The housing 10 is substantially rectangularly shaped and includes a vertically extending and substantially rectangularly shaped rear wall 14. A pair of side walls 16 and 18 are rigidly connected to the rear wall 14 and extend forwardly toward the front of the housing. The housing also includes a bottom wall 20 and a top wall 22. Preferably, the forwardmost part of the top wall 22 extends slightly downwardly to form a lip 24.

The forwardmost edges of each of the side walls 16 and 18 extend slightly forwardly of the bottom wall and are turned inwardly toward the opening at the front of the housing to form a pair of vertically extending front flanges 26 and 28. A second pair of flanges are mounted to the inside surface of the side walls parallel to but spaced slightly rearwardly from the front flanges 26 and 28. Only the left flange 30 of the second pair of flanges is visible in the figures. It should be understood, however, that a flange similar to flange 30 is also mounted in a similar manner behind the front flange 28.

Figure 2:
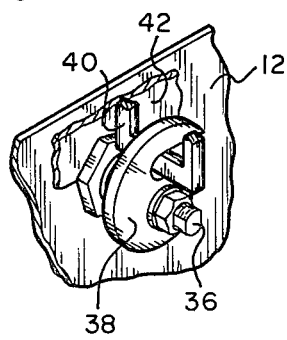
FIG. 2 is a partial cross-sectional view taken through the line 2—2 of FIG. 1.
Figure 3:
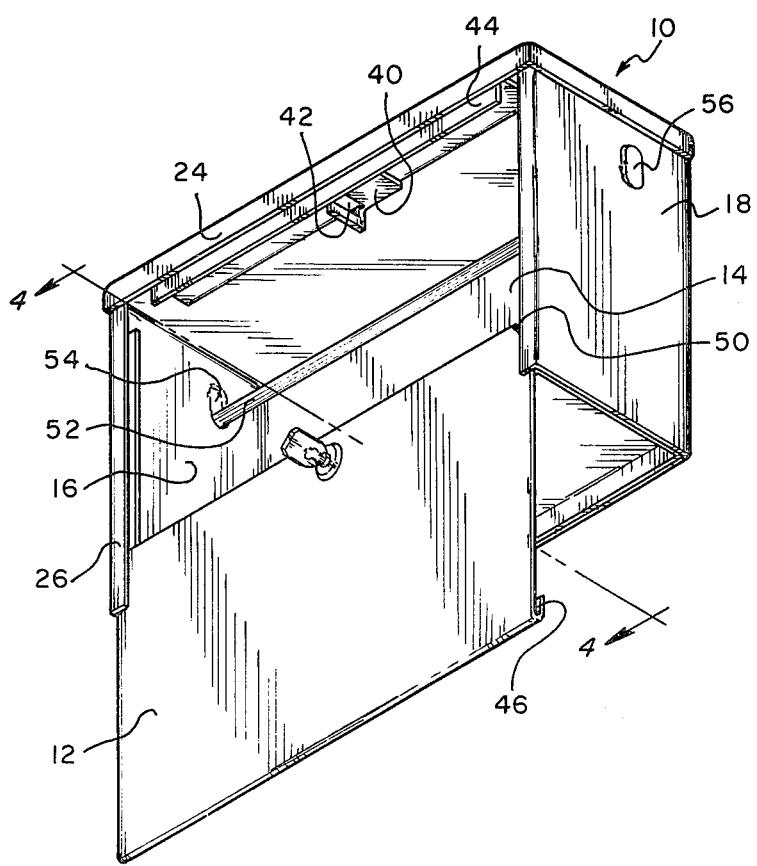
FIG. 3 is a front, bottom perspective view showing the cover member in its open suspended position.

As shown most clearly in FIGS. 3-5, flanges 26 and 30 along with the side wall 16 form a channel 32 which is just slightly wider than the thickness of the front cover member 12 so that the side edges of the cover member can freely slide in the channel 32. While it is not pictured in the figures, it will be understood that a similar channel is formed on the right side of the housing so as to form two opposed channels. It should then be readily apparent that the front cover member 12 can be slid up and down between the closed position shown in FIG. 1 and the opened position shown in FIG. 2 as its side edges are guided in the channel members.

Located adjacent the upper central portion of the cover member 12 is a key locking device 34. The locking device 34 includes a key driven barrel 26 which carries a hook shaped latch 38. A keeper 40 having an opening 42 therein is mounted on the top wall 22 of the housing 10 and extends downwardly from the top wall toward the lock 34. Located forwardly of the keeper 40 and also secured to the top wall is a horizontally extending stiffening member 44.

As shown most clearly in FIG. 2, when the cover member 12 is raised to its uppermost, closed position, lock 34 can be turned so that the latch 38 can enter the opening 42 in the keeper 40 so as to lock the cover member in its closed position. In this position, the housing 10 is substantially tamper proof as it is almost impossible to wedge a screwdriver or similar tool behind the cover member 12 to pry the same open. It is also difficult to push any part of the cover member inwardly due to the flanges such as flange 30 forming the channel members and the stiffening member 44. The stiffening member 44 also makes it impossible for one to insert a tool through the top edge in an attempt to interfere with the locking mechanism. It should be noted that the lower edge of the cover member 12 is turned upwardly to form a channel 46 which cooperates with a lower flange 48 which extends downwardly from the forward edge of the bottom wall 20 to prevent the lower portion of the cover 12 from being pryed off.

Whenever it is necessary for a technician or other authorized person to gain access to the housing, the key lock is turned until the latch 32 moves out of the opening 42 in the keeper 40. At this point, the cover member 12 is then lowered. The cover 12 cannot, however, be removed from simply sliding it downwardly since the lock 34 will hit the lower wall 20 as shown in FIG. 4. This is advantageous, however, since the cover member 12 can simply be left in this position with the same merely suspended out of the way so that the technician can work on the interior of the box. When the technician is finished working, he does not have to hunt for the cover member but merely slides it upwardly and locks it again.

On occasion, it may be necessary to totally remove the cover member 12. Provisions are made for this. Namely, the upper right corner of the cover member 12 is cut off such as shown at 50 in FIGS. 3 and 5. With the cover member 12 in its lowered position such as shown in FIG. 3, the same is then twisted with the lock 34 being the center point of rotation. Because the corner 50 is cut off, the right side of the cover member 12 can be lowered into the position shown in FIG. 5. At this point, the cover member can be moved to the right and outwardly away from the housing. The cover is installed in exactly the reverse manner.

Located within the housing 10 is a strand bar 52. Bar 52 is held in place by a pair of opposed dimples or indentations 54 and 56 in the side walls 16 and 18, respectively. These indentations are punched into the side walls, preferably prior to the housing being fabricated, and as shown most clearly in FIG. 6 they taper downwardly and inwardly. That is, the indentation is deeper at the top than at the bottom. In this way, the bar 52 can be inserted easily into the upper portion of the indentations 54 and 56 and is then moved downwardly until it is rigidly held in place as shown in FIGS. 3, 5 and 6. These indentations 54 and 56 eliminate the need for additional hangers.

The present invention may be embodied in other specific forms without departing from the spirit or essential attributes thereof and accordingly, reference should be made to the appended claims rather than to the foregoing specification as indicating the scope of the invention.

We claim:

1. A substantially rectangularly shaped housing for cable television components comprising:

a rear wall, a pair of side walls, a top wall and a bottom wall, all of said walls being rigidly secured together;

the front of said housing having an opening therein;

the forwardmost edges of each of said side walls extending slightly forwardly of the bottom wall and being turned inwardly toward said opening to form a pair of vertically extending front flanges;

a second pair of flanges mounted to the inside surface of said side walls parallel to but spaced slightly rearwardly from said front flanges to thus form a pair of opposed channel members;

a cover member for covering said opening, said cover member being substantially rectangularly shaped and having opposed side edges adapted to slide within said channel members, one of the upper corners of said cover member being removed, and a lock member carried by the upper portion of said cover member and extending inwardly toward the interior of said housing.

2. The housing as claimed in claim 1 wherein the forward edge of said bottom wall is bent downwardly to form a lower flange and wherein said cover member has its lower edge turned upwardly to form a channel which cooperates with said lower flange.

3. The housing as claimed in claim 1 wherein said lock member carries a hook shaped latch within said housing and wherein a keeper extends downwardly from said top wall to cooperate with said latch.

4. The housing as claimed in claim 3 further including a horizontally extending stiffener member secured to said top wall in front of said keeper but behind said cover member to prevent the upper edge of said cover member from being moved inwardly.

5. The housing as claimed in claim 1 wherein each of said side walls includes an indentation therein which tapers downwardly and inwardly and further including a strand bar which extends between and is supported by said indentations.

6. A substantially rectangularly shaped housing for cable television components comprising:

a rear wall, a pair of side walls, a top wall and a bottom wall, all of said walls being rigidly secured together;

the front of said housing having an opening therein;

the forwardmost edges of each of said side walls extending slightly forwardly of the bottom wall and being turned inwardly toward said opening to form a pair of vertically extending front flanges;

a second pair of flanges mounted to the inside surface of said side walls parallel to but spaced slightly rearwardly from said front flanges to thus form a pair of opposed channel members;

a cover member for covering said opening, said cover member being substantially rectangularly shaped and having opposed side edges adapted to slide within said channel members, and a lock member carried by the upper portion of said cover member and extending inwardly toward the interior of said housing.

7. The housing as claimed in claim 6 wherein the forward edge of said bottom wall is bent downwardly to form a lower flange and wherein said cover member has its lower edge turned upwardly to form a channel which cooperates with said lower flange.

8. The housing as claimed in claim 6 wherein said lock member carries a hook shaped latch within said housing and wherein a keeper extends downwardly from said top wall to cooperate with said latch.

9. The housing as claimed in claim 6 further including a horizontally extending stiffener member secured to said top wall behind said cover member to prevent the upper edge of said cover member from being moved inwardly.

10. The housing as claimed in claim 6 wherein each of said side walls includes an indentation therein which tapers downwardly and inwardly and further including a strand bar which extends between and is supported by said indentations.

* * * * *